July 20, 1965 K. HUBNER 3,196,285

PHOTORESPONSIVE SEMICONDUCTOR DEVICE

Filed May 18, 1961 2 Sheets-Sheet 1

KURT HUBNER
*INVENTOR.*

*BY*

Flehr and Swain
ATTORNEYS

July 20, 1965 K. HUBNER 3,196,285

PHOTORESPONSIVE SEMICONDUCTOR DEVICE

Filed May 18, 1961 2 Sheets-Sheet 2

KURT HUBNER
*INVENTOR.*

*BY* Flehr and Swain
ATTORNEYS

United States Patent Office 3,196,285
Patented July 20, 1965

3,196,285
PHOTORESPONSIVE SEMICONDUCTOR DEVICE

Kurt Hubner, Palo Alto, Calif., assignor to Clevite Corporation, a corporation of Ohio Filed May 18, 1961, Ser. No. 111,009
5 Claims. (Cl. 307—88.5)

This invention relates generally to a photoresponsive semiconductor device and more particularly to a switching photoresponsive semiconductor device.

One type of switching semiconductor device includes four successive layers of semiconductor material with contiguous layers being of opposite conductivity type to form three rectifying junctions. Ohmic connection is made to the outer layers.

Operation of the switching device is generally as follows. As current flows across the reversely biased center junction, the outer junctions inject minority carriers into the center layers. The carriers from the adjacent outer junctions flood the center layers, each of which is the base layer of a three layer structure, with minority carriers. This current flow causes an increase in the current transfer ratio alpha in the base layers until saturation and turn-on occurs. The center junction is switched to a forward biased "on" condition.

The initial current may be caused by (1) increasing the voltage across the center junction until the electric fields established across the center junction are sufficient to produce avalanche multiplication; (2) providing an ohmic connection to one of the middle base layers and injecting minority carriers into the base layer; or (3) creating current flow by impinging light on the center junction to generate carriers within the space charge region or within one diffusion length of the same. Then carriers are swept across the junction and cause current to flow through the device which results in current being injected into the base layers from the outer emitter junctions.

Once the device has switched into its low impedance condition by increasing the alpha of the pair of three layered structures to a value above one, the device remains in this condition until the current flowing through the same is reduced to a value in which the alpha is reduced below unity.

Four layer switching devices of the type described above have been used as photoresponsive switching devices. The center junction being exposed to light energy from the ultra-violet, visible and near infra-red regions of the spectrum generates hole electron pairs. The hole electron pairs generated within the space charge region of the center junction or closely adjacent thereto are swept across the center junction. This causes an increase in current flowing through the device and consequently, an increase in current density. In devices in which alpha increases with increasing current, this results in an increase in alpha of the pair of three layered structures (transistors). With sufficient light intensity, the total current flowing will increase to a value in which the density is sufficent to cause the sum of the alphas to reach a value greater than one. The device swtiches into the low impedance state.

The device is operated by applying a voltage below the breakdown or avalanche voltage of the center junction. When the appropriate level of illumination is reached, sufficient current will flow through the device to give a current density in which the sum of the alphas will be greater than unity and the device switches into the low impedance state.

Photoresponsive semiconductor devices of the prior art have, in general, emitter junctions and a collector or center junction of substantially the same areas. Relatively high light values are required to achieve current densities sufficient to cause the device to switch. Devices of the prior art respond to heat (phonon) energy to generate hole electron pairs. Thus, the device may switch in response to heat as well as light energy.

It is a general object of the present invention to provide an improved photoresponsive semiconductor switching device.

It is another object of the present invention to provide a photoresponsive semiconductor switching device having a relatively high sensitivity.

It is another object of the present invention to provide a photoresponsive semiconductor device having relatively high sensitivity to light energy and relatively low sensitivity to heat energy.

It is another object of the present invention to provide a four layer semiconductor device in which the current density at at least one of the outer junctions is substantially increased by controlling the size of the various junctions.

It is another object of the present invention to provide a four layer switching semiconductor device in which there is provided a relatively large area for generating carriers in response to light energy and which includes at least one small "emitter" junction whereby the current density through said "emitter" junction is sufficient to cause the sum of the alphas of the "transistor" pair to exceed one at relatively low light intensity.

These and other objects of the invention will become more clearly apparent from the following description when taken in conjunction with the accompanying drawing.

Referring to the drawing.

Figure 1:
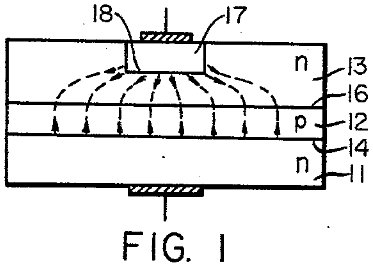
FIGURE 1 is a sectional view taken along the line 1—1 of FIGURE 2 showing a photoresponsive four layer semiconductor switching device in accordance with the present invention.
Figure 2:
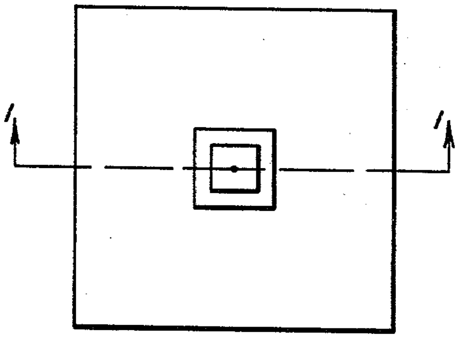
FIGURE 2 is a plan view of the four layer semiconductor switching device shown in FIGURE 1.

Referring to FIGURES 1 and 2, there is shown a photoresponsive semiconductor switching device which includes three successive layers 11, 12 and 13 forming junctions 14 and 16. A region or layer 17 is inset into the layer 13 and forms a junctoin 18 therewith. This junction extends substantially less in both the $x$ and $y$ dimensions of the device than the center or collector junction. Thus, there are formed two junctions 14 and 16 having a relatively large area in comparison to the area of junction 18. In the device illustrated, the layers 11, 12, 13 and 17 are n, p, n and p-type semiconductive material, respectively. It will, of course, be understood that the device may have a p-n-p-n structure rather than the n-p-n-p structure described above. ohmic contact is made to the outer regions 11 and 17 for connecting an external circuit to the device.

Figure 8:
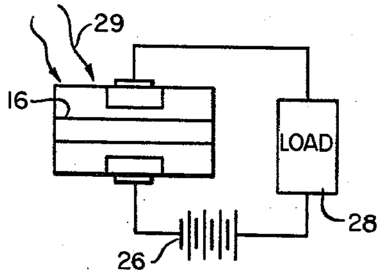
FIGURE 8 shows a photoresponsive switching device connected to control application of power to a load.

Referring to FIGURE 8, the device is shown connected in series with a battery 26 and a load 28. Light energy is indicated by the arrows 29. The device operates in response to the light energy to selectively connect the load to the battery or power source. Four layer devices are capable of passing relatively large amounts of power because of the relatively low voltage drops across the same, and thus the load can be connected directly across the device without the necessity of relays or other active elements interposed between the circuit including the photoresponsive element and the circuit which controls the application of power to the load.

Operation of the photoresponsive semiconductor switching device of the present invention may be understood more clearly with reference to FIGURE 1. Carriers generated by photons within the space charge region of the collector junction 16 will be swept across the junction and will cause current flow through the device. Likewise, hole electron carriers or hole electron pairs formed by the photoelectric energy within one diffusion length of the space charge region of the center junction may diffuse into the space charge region and be swept across the junction. The current flowing across the junction 16 must flow through the remainder of the device. Thus, the current has a relatively low density through the center junction but has a substantially higher current density in the outer junction 18 which is of smaller area than the junctions 14 or 16. Thus, in effect, the current flowing into the region junction 18 is concentrated. The current density is relatively high to give a relatively high alpha with small generated currents in the space charge region of the center junction. Consequently, the current flowing through the device can be increased to a value of sufficient magnitude to cause switching of the device in response to relatively low light intensity.

Thus, there is provided a photoresponsive semiconductor switching device in which there is provided a relatively large area for the generation of carriers in response to light energy, that is, the total junction 16 is exposed to light penetrating from the edges and through the n-type layer 13 into the space charge region of the junction. A relatively small area emitter junction is formed whereby the density across the junction 18 is substantially higher than in the junction 16. The alpha of this part of the device increases rapidly so that the sum of the alphas of the two transistors will exceed one. The increase in density between the center and outer junction is proportional to the area.

Figure 7:
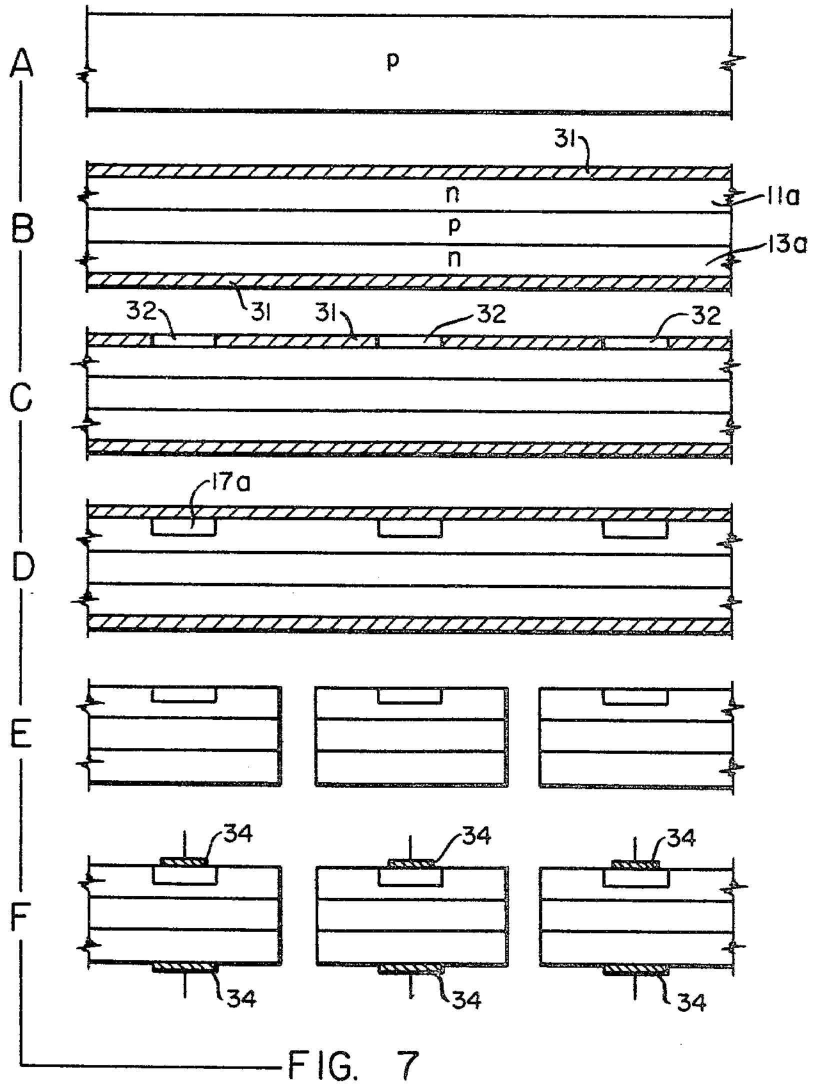
FIGURES 7A–7F show the steps in forming a photoresponsive semiconductor switching device of the type shown in FIGURES 1 and 2.

The device shown in FIGURE 1 may be formed in the manner illustrated in FIGURES 7A–F. Thus, a wafer of p-type semiconductor material, FIGURE 7A, is subjected to a diffusion operation to form n-type diffusion layers **11*a* and 13*a*, FIGURE 7B. During the diffusion operation, an oxide layer 31 will be formed on the surface of the device. The device is then suitably masked with a layer of acid resist and subjected to an etching operation which serves to remove exposed portions of the oxide layer to form a plurality of windows 32, FIGURE 7C. The device is then subjected to another diffusion to form inset p-type regions 17*a*, FIGURE 7D. The device may then be cleaned and diced to form a plurality of devices such as shown in FIGURE 7E. Ohmic contact 34** may be applied to the outer layers, FIGURE 7F.

Figure 3:
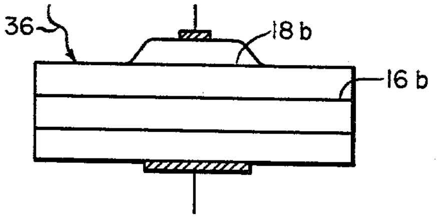
FIGURE 3 shows another photoresponsive semiconductor switching device incorporating the present invention.
Figure 4:
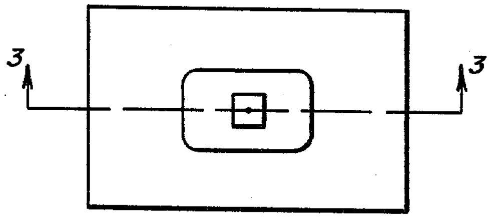
FIGURE 4 is a plan view of the semiconductor device of FIGURE 3.

In FIGURES 3 and 4, there is illustrated another device in accordance with the present invention. The device of FIGURE 3 is formed in the conventional manner by forming four successive layers with the contiguous layers being of opposite conductivity type. Subsequently, the device is masked with an acid resisting material such as a wax dot or the like and etched to completely remove the exposed material. The etching operation is carried out until the exposed material is etched beyond the junction **18*b*. Thus, in FIGURE 3, the n-type layer is completely removed and a small portion of the p-type layer is also removed. As a result, there is a relatively large collector junction 16*b* which serves for the generation of carriers within the space charge region and the consequent flow of current across the junction, and a relatively small emitter junction 18*b* which will inject sufficient current into the adjacent base region. Thus, there is a high current density adjacent the emitter junction 18*b***, which current density is sufficient to increase the alpha so that the sum of the alphas of the transistors increases above one to cause switching of the device with applied voltages substantially below avalanche voltage for the center junction.

It is observed in the device of FIGURES 3 and 4 that the etching may be continued until the p-type layer is relatively thin. Photons impinging on the upper surface, schematically illustrated by the arrow 36, will penetrate to the space charge region of the collector junction **16*b*** and serve to generate hole electron pairs which are swept across the junction and give rise to a current flow in the device in the manner described above.

Figure 5:
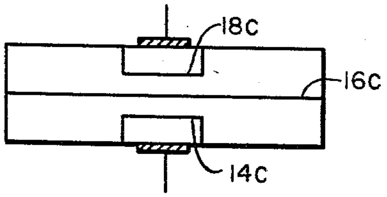
FIGURE 5 shows another photoresponsive semiconductor switching device in accordance with the invention.

The sensitivity may be further increased by providing a pair of inset regions forming small area emitter junctions, such as shown in FIGURE 5. Thus, the large area collector junction 16 is disposed between a pair of relatively small area emitter junctions **14*c* and 18*c***. The device of FIGURE 5 will have a substantially higher sensitivity than that of FIGURE 1.

Figure 6:
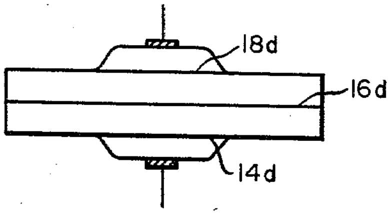
FIGURE 6 shows still another semiconductor switching device in accordance with the present invention.

In FIGURE 6, a device similar to that in FIGURES 3 and 4 is illustrated. In the device of FIGURE 6, the upper and lower surfaces are raised to form relatively small area emitter junctions **14*d* and 18*d* with a relatively large collector junction 16*d*. The n-type and p-type regions forming a collector junction 16** may be relatively thin to thereby further increase the sensitivity by permitting easy penetration of light energy (photons) into the collector junction.

In each of the devices discussed above, the effect of the small emitter junction is to substantially increase the current density at the emitter junctions and thus to cause switching with relatively low light intensity. Preferably, the area of the outer or "emitter" junction is less than one-fourth that of the center junction. In certain instances where extremely high sensitivity is desired, the area may be one-hundredth or less than that of the center junction.

In summary then, there is provided a photoresponsive semiconductor switching device which has relatively high sensitivity. The increased sensitivity is achieved by providing a relatively large area collector junction for the generation of carriers in response to photons "light energy" and at least one emitter junction having a relatively small area whereby the current flowing through the device is concentrated. The increase in current density results in a relatively high alpha for the respective "transistor" so the sum of the alphas of the two transistors forming the switching device exceeds one at relatively low light intensity.

I claim:

1. A photoresponsive semiconductor switching device comprising a first layer of one conductivity type and a second layer of opposite conductivity type, said layers having contiguous surfaces forming a first rectifying junction having a first area, said first layer comprising means for photoelectrically generating carriers within one diffusion length of the space charge region of the first rectifying junction, a third region of opposite conductivity type forming a second rectifying junction at the other surface of said first layer, said second rectifying junction having an area which is substantially smaller than the area of the first junction, and a fourth region of said one conductivity type forming a third rectifying junction on the other surface of the second layer, ohmic contact formed with said third and fourth regions, and means for applying a voltage between said third and fourth regions whereby current flow due to carriers generated in the space charge region of the first junction is concentrated at said second rectifying junction.

2. A semiconductor device as in claim 1 wherein both of said outer junctions have an area which is substantially less than that of the center junction.

3. A semiconductor device as in claim 1 in which the area of the said one outer junction is less than one-fourth that of the center junction.

4. A semiconductor device as in claim 1 in which the area of one of the outer junctions is one-hundredth that of the center junction.

5. A semiconductor device as in claim 1 in which the area of one of the outer junctions is one-thousandth that of the center junction.

References Cited by the Examiner

UNITED STATES PATENTS

| | | | | |
|---|---|---|---|---|
| 2,971,139 | 2/61 | Noyce | 317—235 | |
| 2,980,832 | 4/61 | Stein et al. | 317—235 | |
| 2,993,154 | 7/61 | Goldey et al. | 317—235 | |
| 3,064,132 | 11/62 | Strull | 317—235 | X |
| 3,065,116 | 11/62 | Marinace | 148—33.1 | X |

DAVID J. GALVIN, *Primary Examiner.*

JAMES D. KALLAM, *Examiner.*